United States Patent [19]

Karema et al.

[11] Patent Number: 5,061,928
[45] Date of Patent: Oct. 29, 1991

[54] SYSTEM AND METHOD OF SCALING ERROR SIGNALS OF CASELOAD SECOND ORDER MODULATORS

[75] Inventors: Teppo J. Karema; Tapani J. Ritoniemi; Aaine H. Tenhunen, all of Tampere, Finland

[73] Assignee: Oy Nokia AB, Helsinki, Finland

[21] Appl. No.: 430,265

[22] Filed: Nov. 2, 1989

[30] Foreign Application Priority Data

Nov. 9, 1988 [FI] Finland .................................. 885156

[51] Int. Cl.⁵ ............................................ H03M 3/02
[52] U.S. Cl. ....................................... 341/143; 375/34
[58] Field of Search ...................... 375/26, 27, 28, 29, 375/33, 34; 341/143, 144, 155, 172

[56] References Cited

U.S. PATENT DOCUMENTS

| | | | |
|---|---|---|---|
| 4,704,600 | 11/1987 | Uchimura et al. | 341/122 |
| 4,733,219 | 3/1988 | Reusens | 341/144 |
| 4,843,390 | 6/1989 | Van Bavel et al. | 341/139 |
| 4,862,169 | 8/1989 | Van Bavel et al. | 341/143 |
| 4,876,542 | 10/1989 | Van Bavel et al. | 341/143 |
| 4,920,544 | 4/1990 | Endo et al. | 375/26 |

*Primary Examiner*—Howard L. Williams
*Attorney, Agent, or Firm*—Finnegan, Henderson, Farabow, Garrett and Dunner

[57] ABSTRACT

The invention relates to a method of cascading two or more sigma-delta modulators by applying an error signal representing the quantization error of a preceding modulator to a subsequent modulator in the cascade to be quantized therein, the quantized error signal being thereafter differentiated and subtracted from the quantized output signal of the preceding modulator. To improve the performance of the cascade, in the method according to the invention, the error signal is scaled before said subsequent modulator by a first factor smaller than 1, and the quantized error signal is scaled by a second factor substantially equal to the inverse of the first factor, before being subtracted from the quantized output signal of said preceding modulator.

12 Claims, 2 Drawing Sheets

SYSTEM AND METHOD OF SCALING ERROR SIGNALS OF CASELOAD SECOND ORDER MODULATORS

FIELD OF THE INVENTION

The invention relates to sigma-delta modulators and in particular to a method of cascading two or more sigma-delta modulators by applying an error signal representing the quantization error of a preceding modulator to a subsequent modulator in the cascade to be quantized therein, the quantized error signal being thereafter differentiated and subtracted from the quantized output signal of the preceding modulator.

BACKGROUND OF THE INVENTION

As described, e.g., in "A Use of Double Integration in Sigma-Delta-Modulation" IEEE Trans. on Comm., COM-33, p. 249-258, March 1985, the sigma-delta modulator comprises at least one integration stage or filter followed by a quantization stage (comparator) and a feedback from the output of the comparator to the input of the integration stage. Dependinq on the number of integration stages, sigma-delta modulators can be divided into second-order, third-order or fourth-order sigma-delta modulators. Such high-order sigma-delta modulators (SDM) have recently become increasingly interesting in audio and ISDN applications. This is due to the fact that the introduction of high-order modulators increases the number of integrations to be carried out, which results in a decrease in the noise level of the pass band, the quantization noise being shifted to a higher frequency level. This is called quantization noise shaping through integration. This technique provides improved signal-to-noise ratio and improved precision. Thus a high-order sigma-delta modulator would offer an interesting application in A/D or D/A converters.

However, the practical realization of a sigma-delta modulator formed by conventionally series-connected integrators is problematic due to the oscillation caused by the feedback loop. It is suggested in "A 16-bit Oversampling A-to-D Conversion Technology Using Triple-Integration Noise Shaping", IEEE Journal of Solid State Circuits, Vol. SC-22, No. 6, December 1987, p. 921-929, that this problem could be overcome by means of a high-order sigma-delta modulator system formed by cascading several stable first-order sigma-delta modulators. This technique will be called a MASH technique hereinafter. The quantization error of a signal first in the cascade was applied to a sigma-delta modulator second in the cascade to be quantized into an error signal. The quantization error signal was differentiated by a digital differentiator which performed digitally the noise transfer function of the integrator of the first modulator. Thereafter the quantized error signal was subtracted from the quantized output signal of the first modulator, whereby there remains only the quantization noise of the second modulator. Correspondingly, the quantization error of the second modulator was applied to a modulator third in the cascade. The quantized output of the third modulator, in turn, was subtracted from the quantized output signal of the second modulator, and the quantized output signal was subtracted from the output of the first modulator, whereby the third-order quantization noise only remained at the output of the system. In this way, a stable third-order sigma-delta modulator was obtained. An A/D converter realized in this way provides a 16-bit signal-to-quantization noise ratio (S/Nq) within the audio band (24 kHz).

Increase in the number of cascaded stages requires greater precision from each individual modulator component if the bit resolution is to be increased. Therefore the realization of a modulator system of an order higher than that described above by adding to the cascade a forth or fifth first-order sigma-delta modulator easily causes problems. Modulators are generally realized on integrated circuits, whereby an increased number of modulators requires more chip area. The area of the chip should also be increased because the character of the first-order modulator requires that the first modulator has to be realized in differential form and a common-mode rectangular wave having a frequency outside the pass band has to be connected to the input (dither).

SUMMARY OF THE INVENTION

The object of the present invention is to provide a high-order sigma-delta modulator system which provides an improved signal-to-quantization noise ratio, being nevertheless simpler in structure and requiring less from the analog structures of the modulator than previous systems.

This is achieved by means of a method according to the invention, in which the error signal is scaled before said subsequent modulator by a first factor smaller than 1, and the quantized error signal is scaled by a second factor substantially equal to the inverse of the first factor, before being subtracted from the quantized output signal of said preceding modulator.

The invention is based on the finding that at the output of the first modulator of the cascade, for instance, the combined level of the main signal and the feed-backed quantization noise summed to the main signal exceeds considerably the level of the signal at the input of the modulator. As a result of this, the level of the error signal to be applied to an input in a subsequent modulator is also high. In the feedback of the modulator, a plus or minus signed internal reference voltage is summed to the input of the integrator, depending on the output of the quantization unit. These reference voltages define the maximum modulator input levels. If the first modulator utilizes its entire dynamic range, the level of an error signal applied to a subsequent modulator is so high that it exceeds the given reference levels at least intermittently, causing malfunction of the second modulator. In the present invention, this is avoided by scaling the level of the error signal to be applied to the subsequent modulator by a predetermined scaling factor so that the modulator will not be overdriven whereas its maximum dynamic range will be utilized. The error signal quantized by the modulator is then multiplied in a digital multiplier by a second scaling factor which is the inverse of the first coefficient so that the level of the quantized error signal to be subtracted from the quantized output of the first modulator is equal to the level of the actual quantization error. By using the scaling according to the invention, each modulator operates over its optimal dynamic range, which improves substantially the signal-to-noise ratio of the system.

In a preferred embodiment of the invention, second-order sigma-delta modulators each having a transfer function substantially equal to one are cascaded. These modulators are preferably additionally provided with two feedbacks, which improves the stability of the modulator. With second-order modulators, the above-mentioned scaling is even more important than with first-order modulators, because the summed level of the noise and the main signal before quantization is as high as about three to four times the signal level at the input of the modulator. Thereby an integer preferably equal to or greater than 2 is selected as the second scaling factor because binary multiplication by these integers is simple to carry out. The inverse of these factors is selected as the first scaling factor. Particularly preferably, the first factor is 0.25 and the second is 4.

Cascading two second-order sigma-delta modulators according to the invention gives a system at the output of which fourth order quantization noise only occurs. Theoretically, this solution provides a signal-to-quantization noise ratio (S/Nq) in excess of 18 bits at a sampling frequency of about 2.8 MHz within the audio band (24 kHz) and 13 bits within the ISDN band (80 kHz). The present structure, however, is simpler and utilizes the chip area more efficiently than the above-mentioned MASH structure, because no dither signal is required and the precision required from the gain of the operational amplifier and the capacitors is smaller.

BRIEF DESCRIPTION OF THE DRAWINGS

The invention will now be described in greater detail by means of embodiments with reference to the attached drawing, wherein.

PREFERRED EMBODIMENTS OF THE INVENTION

Figure 1:
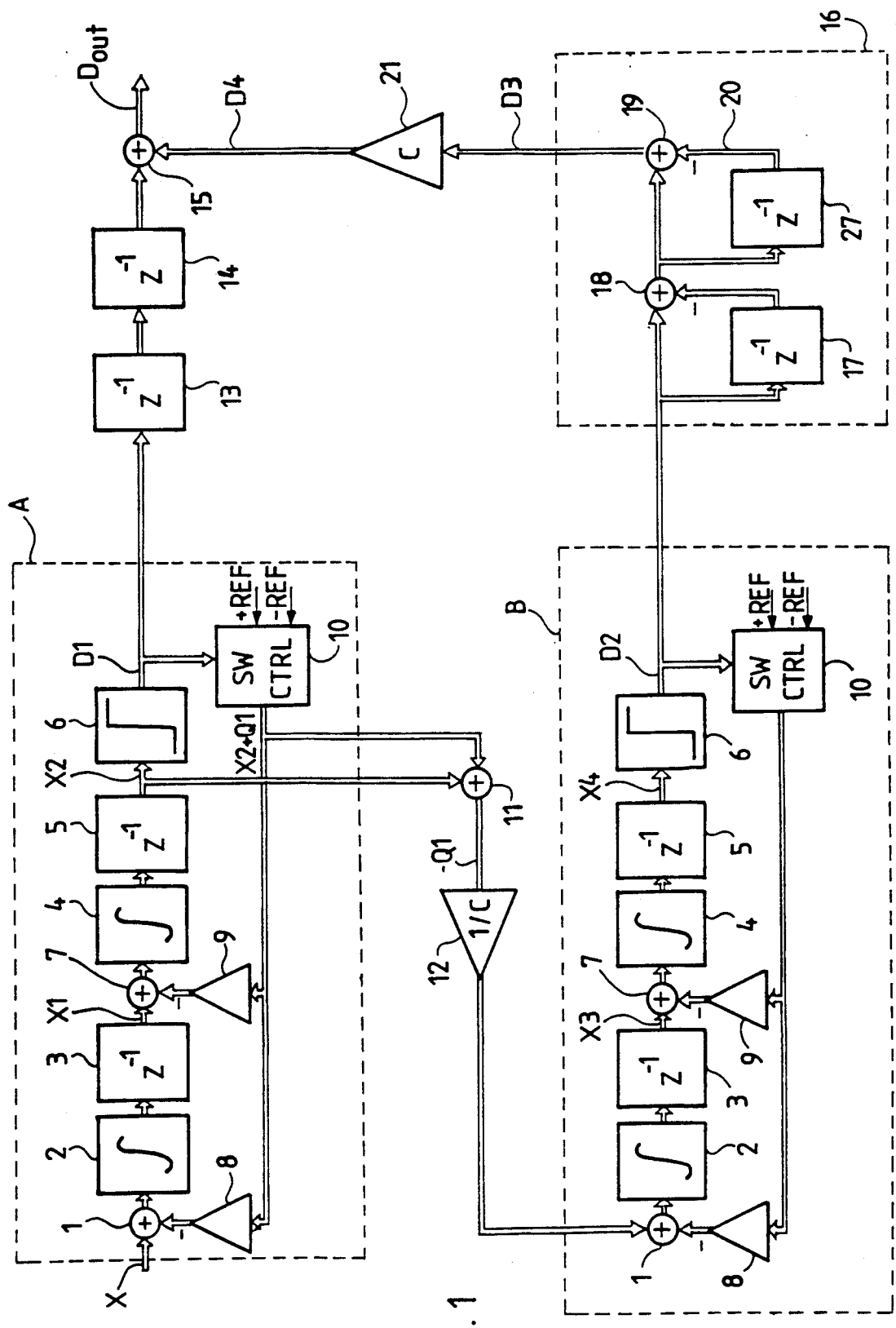
FIG. 1 shows a block diagram of a system according to the invention with two cascaded second-order modulators.

The system of FIG. 1 comprises two substantially identical second-order sigma-delta modulators A and B. For facilitating the understanding of the invention, corresponding parts in the modulators A and B are indicated with the same reference numerals. Each modulator A and B comprises a series-connection of the following components in this order: a summing means 1, an integrating means 2 (or filter), a summing means 7, an integrating means 4 (or filter) and a quantization unit or comparator 6 at the output of which a final quantized signal D1 or D2 occurs. Each modulator A and B comprises a two-part negative feedback. The feedback comprises a switching unit 10 having an input to which the quantized output signal D1 or D2 is applied and an output connected through a scaling means 8 to one input in the summing means 1 to be subtracted from the input signal and through a scaling means 9 to one input in the summing means 7 to be subtracted from the output signal of the first integrator 2. The switching unit 10 connects either a positive reference voltage +REF or a negative reference voltage −REF to its output, depending on the state of the quantized output signal D1 and D2. The first scaling means 8 scales the output of the switching unit 10 with the number 1 while the second scaling means 9 scales the output of the switching unit 10 with the number 2. The blocks 3 and 5 in FIG. 1 illustrate the delay contained in the integrating means 2 and 4, respectively. Since both integrators 2 and 4 comprise a delay in this specific case, the transfer function of the modulators A and B will be equal to one when the ratio of the scaling factor of the first scaling means 8 to that of the second scaling means 9 is 1:12.

Figure 2:
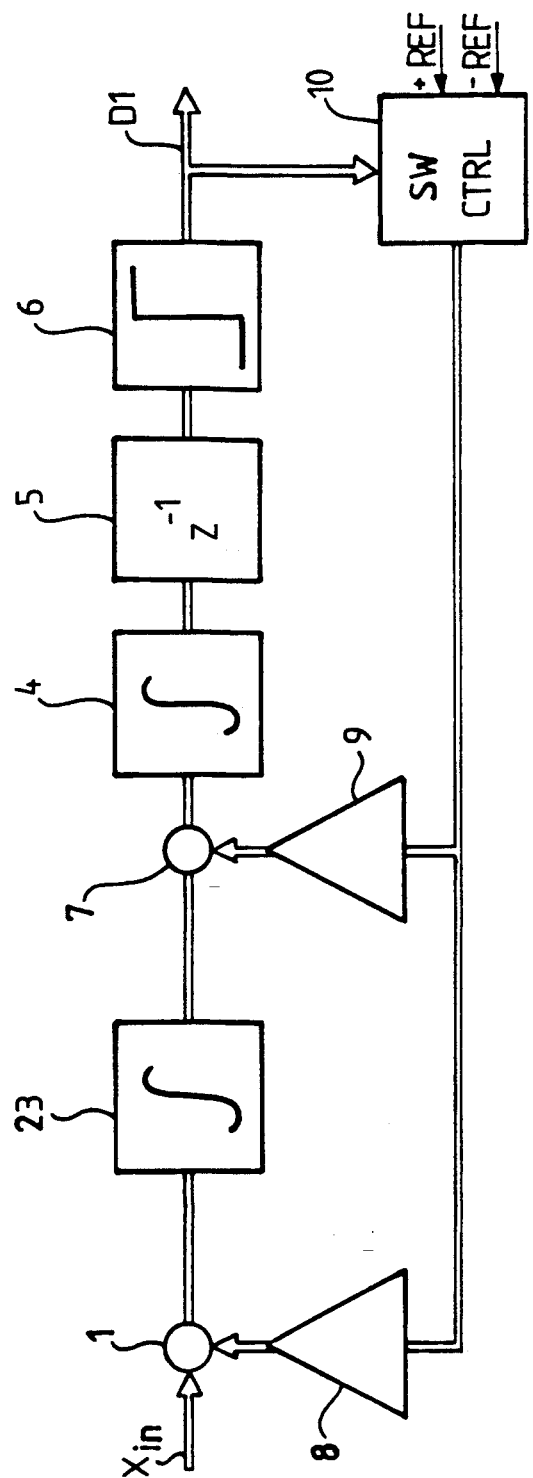
FIG. 2 shows a block diagram of an alternative second-order modulator for use in the system of FIG. 1.

FIG. 2 shows an alternative second-order sigma-delta modulator, which can replace either one or both of the modulators A and B of FIG. 1. In FIG. 2, corresponding parts are indicated with the same reference numerals as in FIG. 1. Mainly the differences only will be described hereinbelow. The delayed first integrator 2 of FIG. 1 has been replaced with an undelayed integrator 23. The second integrator 4 has the delay 5 in this case as well. Thereby one of the delays 13 and 14 shown in FIG. 1 is left out. Because of the undelayed integrator 23, the scaling factor of both scaling means 8 and 9 is equal to one in order that the transfer function of the modulator would be 1. An advantage of this alternative modulator is the lower noise level because its feedback factors are equal. This means that the whole available dynamic range of the integrator can be utilized with less capacitor scaling. An advantage of the delayed modulator structure described in FIG. 1 is that the output impedances of the reference voltage sources +REF and −REF may be higher than in the case of FIG. 2 because no Miller capacitance is connected to the reference voltage source at the sampling stage. The techniques used in the manufacture of the integrated circuits in each particular case determine which one of these alternatives is selected.

The quantized output signal D1 of the modulator A in FIG. 1 can be presented by the equation:

$$D1 = X + (1-Z^{-1})^2 \cdot Q1 \qquad (1)$$

where

X is an analog input signal applied to the system;

Q1 is the quantization noise of the comparator 6, and $(1-Z^{-1})^2$ describes the effect of second-order integration on the noise signal Q1.

An input signal X2 in the comparator 6 of the modulator A is applied to one input in the summing means 11. An output signal X2+Q1 from the switching unit 10 is applied to another input in the summing means 11 and subtracted from the signal X2. In this way, a quantization error signal −Q1 is formed which is the difference between the quantized signal D1 and the unquantized signal X2. The quantization error signal −Q1 is applied to the scaling means 12, which scales the signal by a scaling factor 1/C smaller than one, thus reducing its level so that it suits the subsequent modulator B.

The function of the second modulator is to quantize the quantization error of the first modulator so that it can be subtracted digitally from the quantized output D1. The second modulator B is scaled by the scaling means 12 because it is preferable that both modulators A and B are overdriven at substantially equal input levels.

The second modulator B forms a quantized output signal D2 from the scaled error signal, which can be expressed as the equation:

$$D2 = (1/C) \cdot (-Q1) + (1-Z^{-1})^2 \cdot Q2 \qquad (2)$$

wherein

Q2 is the quantization error of the comparator 6 of the modulator B; and $(1-Z^{-1})^2$ represents the effect of second-order integration on the error signal −Q1 in the modulator B.

The quantized output signal D2 of the modulator B is applied to a differentiator unit 16 which subjects the quantized error signal to the same noise transfer function as the integrating means 2 and 4 of the modulator A. The differentiator unit 16 comprises two series-connected digital differentiators, which in a manner known per se are formed by a summing means 18 and 19, respectively, and a delay 17 and 24 of one clock period, respectively. An output D3 in the differentiator unit is applied to a digital scaling means 21 which scales the signal D3 by a scaling factor C which is substantially equal to the inverse of the scaling factor 1/C of the scaling means. The value of the quantized error signal D4 at the output of the scaling means 21 thus corresponds to the actual level of the quantization error signal $-Q1$ appearing at the input of the scaling means 12. The signal D4 can be described by the following equation:

$$D4 = -Q1 \cdot (1-Z^{-1})^2 + C \cdot (1-Z^{-1})^4 \cdot Q2 \quad (3)$$

Thereafter the signal D4 is summed at the summing means 15 to the quantized output signal D1 of the modulator A, which is delayed with two clock period, illustrated with the delay blocks 13 and 14. These delay blocks 13 and 14 compensate for the delays 3 and 5 of the integrating means 2 and 4.

The final output signal Dout of the system can be presented by the following equation:

$$Dout = X + C \cdot (1 = Z^{-1})^4 \cdot Q2 \quad (4)$$

As appears from Equation 4, the final output signal Dout comprises only the original signal and the forth-order noise.

It is to be understood that when the system is applied in practice, all the blocks shown in the attached drawings cannot be separated as separate circuit components. For example, when using so called switched capacitors, the summing means 11, the scaling means 12, the summing means 1 and the scaling means 8 can be realized by different capacitance values connected to the input of the integrator 2, as is wellknown to those skilled in the art. The other summing and scaling means at the inputs of the integrators can be realized in the same manner. It is thereby not possible to clearly distinguish between all signals described as separate above.

The invention can be applied particularly in A/D converters. Thereby a digital filter is connected after the modulator system.

The modulators A and B of FIG. 1 can be replaced with fully digital modulators, the inputs of which are multi-bit digital signals; correspondingly, the summing means 11 and the scaling means 12 may be realized in digital form, which provides a system which converts the multi-bit input into one-bit output. To be accurate, the signal Dout is not a one-bit signal, so a means converting the output into one-bit form has to be provided at the output of the system. Otherwise the same matters as disclosed in connection with FIG. 1 apply to this kind of digital modulator system. It is particularly suited to a D/A converter, whereby its output comprises an analog filter.

It is further to be understood that the figures and the description related thereto are only intended to illustrate the operation of the present invention. In their details, the method and the system according to the present invention may vary within the scope of the attached claims.

We claim:

1. A method of cascading at least two second order sigma-delta modulators, comprising the steps of applying an error signal representing a quantization error of a preceding modulator to a subsequent modulator in the cascade to be quantized therein;
   scaling said error signal of the preceding modulator by a first factor smaller than 1, before being applied to said subsequent modulator;
   differentiating the quantized error signal;
   scaling said differentiated quantized error signal by a second factor substantially equal to the inverse of the first factor; and
   subtracting the scaled differentiated quantized error signal from a quantized output of the preceding modulator.

2. A method according to claim 1, wherein the step of scaling by the second factor constitutes scaling by an integer equal to or greater than 2, the second factor being an inverse of the first factor.

3. A method according to claim 1 wherein the two second-order sigma-delta modulators each have a transfer function substantially equal to 1, and wherein the step of differentiating the error signal quantized by the subsequent modulator in the cascade includes differentiating the error signal twice.

4. A method according to claim 3, wherein the step of scaling by the second factor constitutes scaling by an integer equal to or greater than 2, the second factor being an inverse of the first factor.

5. A sigma-delta modulator system comprising
   a first second order sigma-delta modulator for quantizing a main signal:
   means for producing an error signal representing a quantization error of the first sigma-delta modulator;
   first means for scaling the error signal by a first scaling factor smaller than one;
   a second second-order sigma-delta modulator for quantizing said error signal scaled by the first means;
   means for differentiating the quantized error signal;
   second means for scaling the quantized error signal by a second scaling factor substantially equal to the inverse of the first scaling factor; and
   means for subtracting the differentiated quantized error signal from the quantized main signal.

6. A system according to claim 5, wherein the second means for scaling the quantized error signal by a second scaling factor constitutes means for scaling by an integer equal to or greater than 2, the second scaling factor being an inverse of the first scaling factor.

7. A sigma-delta modulator system comprising a first second-order sigma-delta modulator for quantizing a main signal:
   means for producing an error signal representing the quantization error of the first sigma-delta modulator;
   a second second-order sigma-delta modulator for quantizing said error signal,
   each of the first and second modulators having an output from which a first feedback is connected to the input of the respective modulator and a second feedback between integration stages in the respective modulator, the first and second feedbacks having feedback factors selected so that the transfer function of each modulator is substantially equal to one;
   first means for scaling the error signal by a first scaling factor smaller than one before the second modulator;

means for differentiating the quantized error signal;

second means for scaling the quantized error signal by a second scaling factor substantially equal to the inverse of the first scaling factor; and means for subtracting the differentiated quantized error signal from the quantized main signal.

8. A system according to claim 7, wherein the second means for scaling the quantized error signal by the second scaling factor constitutes means for scaling by an integer equal to or greater than 2, the first second scaling factor being the inverse of the first scaling factor.

9. A sigma-delta modulator system comprising:

a first second-order sigma-delta modulator for quantizing a main signal;

means for producing an error signal representing a quantization error of the first sigma delta modulator;

a second second-order sigma-delta modulator for quantizing said error signal, each of the first and second modulators having an output from which a first feedback is connected to an input of the respective modulator and a second feedback between integration stages in the respective modulator, feedback factors being selected so that each modulator has a transfer function substantially equal to one, and wherein both integration stages of each sigma-delta modulator are delayed, the feedback factors of the first feedback and the second feedback being 1 and 2, respectively;

first means before the second modulator for scaling the error signal by a first scaling factor smaller than one;

second means for scaling the quantized error signal by a second scaling factor which is substantially equal to the inverse of the first factor;

means for differentiating the quantized error signal; and means for subtracting the differentiated quantized error signal from the quantized main signal.

10. A system according to claim 9, wherein the second means for scaling the quantized error signal by the second scaling factor constitutes means for scaling by an integer equal to or greater than 2, the first second scaling factor being the inverse of the first scaling factor.

11. A sigma-delta modulator system comprising, a first second-order sigma-delta modulator for quantizing a main signal:

means for producing an error signal representing a quantization error of the first sigma-delta modulator;

a second second-order sigma-delta modulator for quantizing said error signal, each of the first and second modulators having an output from which a first feedback is connected to an input of the modulator and a second feedback between integration stages in the modulator, feedback factors being selected so that the transfer function of each modulator is substantially equal to one, and wherein the first integration stage of each sigma-delta modulator is undelayed and the second integration stage delayed, the feedback factors of the feedbacks being equal;

first means for scaling the error signal from the first modulator by a first scaling factor smaller than one;

means for differentiating the quantized error signal;

second means for scaling the quantized error signal by a second scaling factor substantially equal to the inverse of the first factor; and means for subtracting the differentiated quantized error signal form the quantized main signal.

12. A system according to claim 11, wherein the second means for scaling the quantized error signal by the second scaling factor constitutes means for scaling by an integer equal to or greater than 2, the first second scaling factor being the inverse of the first scaling factor.

* * * * *

UNITED STATES PATENT AND TRADEMARK OFFICE
CERTIFICATE OF CORRECTION

PATENT NO.   : 5,061,928
DATED        : October 29, 1991
INVENTOR(S)  : TEPPO J. KAREMA, ET AL It is certified that error appears in the above-identified patent and that said Letters Patent is hereby corrected as shown below:

On the Title page, item [75], third inventor's name should be
--AARNE--

Signed and Sealed this

Twenty-seventh Day of April, 1993

Attest:

MICHAEL K. KIRK

*Attesting Officer*      Acting Commissioner of Patents and Trademarks